United States Patent [19]

Brust

[11] Patent Number: 4,967,150

[45] Date of Patent: Oct. 30, 1990

[54] METHOD AND APPARATUS FOR PHASE MEASUREMENT OF SIGNALS AT A MEASURING POINT BY AN UNMODULATED PARTICLE BEAM

[75] Inventor: Hans D. Brust, Dudweiler, Fed. Rep. of Germany

[73] Assignee: Siemens Aktiengesellschaft, Berlin and Munich, Fed. Rep. of Germany

[21] Appl. No.: 245,378

[22] Filed: Sep. 16, 1988

[51] Int. Cl.$^5$ .................... G01R 25/00; G01R 31/26
[52] U.S. Cl. ............................ 324/158 R; 324/158 T
[58] Field of Search ......................... 324/158 R,158 T; 250/310, 311

[56] References Cited

U.S. PATENT DOCUMENTS

| 4,387,304 | 6/1983 | Younkin | 324/158 R |
| 4,477,775 | 10/1984 | Fazekas | 324/158 R |
| 4,621,233 | 11/1986 | Davari et al. | 324/158 R |
| 4,678,988 | 7/1987 | Brust | 324/158 R |
| 4,812,748 | 3/1989 | Brust et al. | 324/158 R |

FOREIGN PATENT DOCUMENTS 3725313 6/1988 Fed. Rep. of Germany .
87P8063 2/1989 Fed. Rep. of Germany .

OTHER PUBLICATIONS

"Visualization of Traveling Surface Acoustic Waves Using a Scanning Electron Microscope", by Feuerbaum et al., dated 1980, pp. 503–508.
"Examination of Surface Acoustic Wave Components Using a Scanning Electron Microscope", by Feuerbaum et al., dated 1983, pp. 53–63.
"Excitation of Surface Acoustic Waves Using Electron Acoustic Microscope", by Yamanouchi et al., Japanese Journal of Applied Physics, vol. 23, Suppl. 23-1, Dec. 6, 1984, pp. 191–193.
"Scanned Electron–Beam Probe Shows Surface Acoustic Waves in Action", by Feuerbaum et al., May 19, 1983, Electronics Magazine, pp. 132–136.
"Phase Sensitive Laser Probe for High-Frequency Surface Acoustic Wave Measurement" by Engan IEEE Transactions on Sonics & Ultrasonics, vol. Su. 25, No. 6, Nov., 1978, pp. 372–377.
"A Phase Sensitive Laser Probe for Pulsed Saw Measurements" by Engan, IEEE Transactions on Sonics & Ultrasonics, vol. Su. 29, No. 5, Sep., 1982, pp. 281–283.

Primary Examiner—Reinhard J. Eisenzopf
Assistant Examiner—W. Burns
Attorney, Agent, or Firm—Hill, Van Santen, Steadman & Simpson

[57] ABSTRACT

In the method and apparatus for the phase measurement of arbitrary signals at a measuring point, for example, of surface waves on piezoelectrical substrates, the surface waves are excited on the surface of a specimen having piezoelectrical features. The measuring point on the specimen surface is scanned by a particle beam and a secondary electrical signal at the measuring point is supplied to an evaluation circuit via a detector. A phase detector within the evaluation circuit is operated in a linear region of its output characteristic curve with the use of a feedback. This makes it possible to keep the phase at the phase detector constant. The phase of the signal to be examined, for example, of the surface wave, which is produced at a interdigital transducer is influenced due to the feedback.

35 Claims, 2 Drawing Sheets

METHOD AND APPARATUS FOR PHASE MEASUREMENT OF SIGNALS AT A MEASURING POINT BY AN UNMODULATED PARTICLE BEAM

BACKGROUND OF THE INVENTION

The present invention is directed to a method for phase measurement of signals at a measuring point and is directed to an apparatus for the implementation of this method.

Electronic components in which surface waves are excited and detected by transducer structures on crystal surfaces are gaining increasing significance in communication and radio-frequency technology. Their manufacture in planar technology has great precision, good reproducibility and is relatively economical. Their design can be optimized with computer aided design (CAD). Nonetheless unacceptable deviations between realized and required transfer functions frequently result for such components. Since the causes of these deviations can not be identified or localized merely by measuring the transfer function, the paramaters that characterize a wave field at the surface of the component must be measured with topical resolution, for example with laser and electron probes. Electron beam measuring methods for stroboscopic imaging of the wave fronts of running surface waves in modified scanning electron microscopes are known, for example, from the articles by H. P. Feuerbaum et al, "Visualization of Traveling Surface Acoustic Waves Using Scanning Electron Microscope" (Sem, 1980, I., pages 502 through 509) or "Scanned Electron Beam Probe Shows Surface Acoustic Waves In Action" (Electronics, May 19, 1983, pages 132 through 136).

In order to improve the design of surface acoustic wave components, more and more physical effects (edge reflection, diffraction effects) must be taken into consideration in the CAD models. The imaging of only the wave field is no longer adequate in order to identify which effects have the greatest influence on the transfer behavior of the surface acoustic wave component or in order to determine the model paramaters, so that additional measurements of the propagation speed, of the amplitude and of the phase of surface acoustic waves are necessary.

An important application for the measurement of the phase of, for example, mechanical waves is non-destructive materials testing. In what is referred to as SLAM "Scanning Laser Acoustic Microscope", a mechanical volume wave is coupled into a workpiece to be inspected, the propagation of the volume wave in the workpiece being influenced by disturbances such as cracks and enclosures that may potentially be present. When the wave strikes the surface of the workpiece, then, first, it causes an excursion of the surface and, second, it can also generate surface waves due to mode coupling. An image of the wave distribution on the surface, particularly of the phase of the wave, provides information regarding whether disturbances are present in the workpiece and, when this is the case, of what nature these disturbances are. A non-destructive testing of the workpiece is possible in this fashion.

Previously stroboscopic imagings were usually used for identifying the phase, this being a method that has only extremely low precision. In addition to this method that is actually of more of a qualitative nature, the phase can also be measured with the use of a lock-in amplifier as a phase detector. However, traditional phase detectors, including lock-in amplifiers, exhibit an adequate sensitivity and precision only in a tightly limited phase range. In particular, this applies to all phase detectors having cos $\phi$ characteristic. Further, preceding filters can effect phase distortions and, thus, a falsification of the measurement.

SUMMARY OF THE INVENTION

An object of the present invention is to provide a method and an apparatus of the type initially cited with which the phase of signals at a measuring point can be measured quickly and with high precision.

The method of the present invention is for phase measurement of specimen signals at a measuring point on a specimen. At least one point on a surface of the specimen is scanned by a particle beam. A secondary electrical signal is derived via a detector at the scanned measuring point on the surface of the specimen and is supplied to an evaluation unit having a phase detector The specimen is supplied with drive signals The method comprises keeping the phase of the secondary electrical signal constant at the phase detector.

An apparatus for phase measuring of signals at a measuring point with a particle beam generator for scanning a specimen surface on a specimen has a signal chain for the conversion of a secondary signal derived from the measuring point on the specimen. The signal chain has an evaluation circuit, the evaluation circuit having a phase detector, and the phase detector being fed, via parts of the evaluation circuit, a reference signal having a reference frequency and a secondary signal. The apparatus has a regulator having a first input connected to an output of the phase detector, a reference value being connected to a second input of the regulator, and the output of the regulator providing a control signal.

An advantage obtainable with the present invention is that a precise measurement of the phase of signals at a measuring point within a broad frequency range can be made with extremely high sensitivity and precision.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several figures of which like reference numerals identify like elements, and in which:

DESCRIPTION OF THE PREFERRED EMBODIMENT

Figure 1:
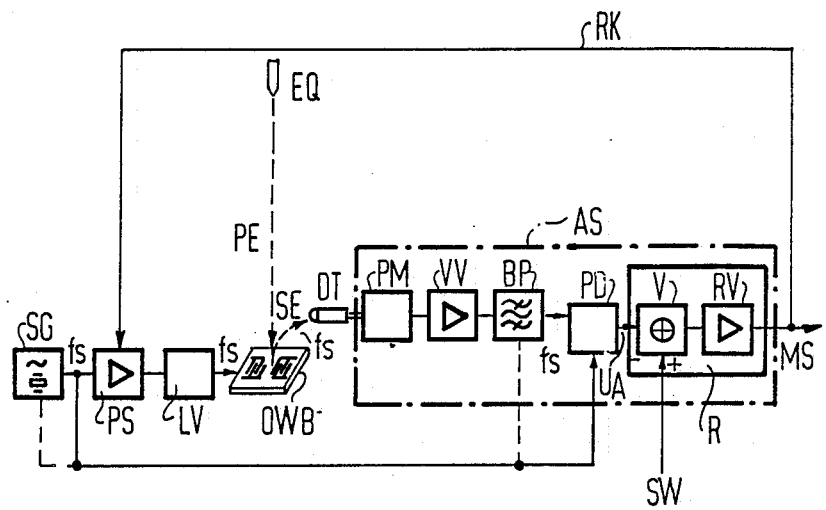
FIGS. 1 and 2 are block diagrams of an apparatus for the implementation of the method of the invention.

FIG. 1 shows a block diagram of a first apparatus for the implementation of the method of the present invention. For measuring the phase of surface acoustic waves at a measuring point on the surface of a surface acoustic wave component OWB, an interdigital transducer IDW on the component OWB is utilized for the emission of acoustic surface waves. This occurs with the use of a signal generator SG that excites the interdigital transducer IDW via a power amplifier LV, exciting it with a sinusoidal voltage having the frequency fs and a phase $\phi$. The alternating voltage at the metal electrodes of the transducer IDW provides periodic deformation of the crystal surface by a piezoelectric effect, these periodic deformations then propagating on the surface wave component OWB as acoustic waves having velocities between about 3000 m/s and 4000 m/s.

The wave penetrates to a depth of about one wavelength into the crystal, whereby the deformation of the surface generally lies in the range between 0.1 and 10 Angstroms By piezoelectric effect, the electro mechanical coupling again produces local surface potentials that can be detected in a reception transducer or can be scanned and detected with an electron beam PE by using a voltage contrast effect. This finely focused primary electron beam PE is preferably generated in the electron-optical column of a modified scanning electron microscope that essentially has an electron gun EQ composed of a cathode, a Wehnelt electrode and an anode, and a series of further magnetic lenses (not shown in FIG. 1 for reasons of clarity) for beam shaping and focusing of the primary electron beam PE.

The secondary electrons SE generated at the respective measuring point in the piezoelectric crystal by the primary electrons PE emerge through the surface of the crystal and are accelerated via an extraction voltage in the direction of the detector DT composed, for example, of a collector, a scintillator and a light guide. The secondary electron current recorded in the detector DT and fluctuating due to the voltage contrast which is dependent on the potential at the measuring point is subsequently supplied to an evaluation circuit AS. The secondary electron current is converted into an electrical signal (voltage contrast signal) in a photomultiplier PM in the evaluation circuit AS and is amplified in a following pre-amplifier VV. For an improvement in the signal/noise relation, the secondary electron signal can be filtered out of the signal frequency by an adjustable band pass filter BP that is tuned to the signal frequency, and which is connected to an output of the pre-amplifier VV. For the control of its center frequency, the band pass filter is connected either to the signal generator SG or to an additional control unit, for example a computer.

The phase $\phi$ of the filtered-out secondary electron signal is detected in the phase detector PD that is connected in circuit after the band pass BP. The phase detector PD needs a reference signal with the reference frequency that corresponds to the signal frequency $f_s$ which in this case is obtained from the signal generator SG.

A lock-in amplifier or a phase-sensitive rectifier can be used as a phase detector. In this case, usually the band pass filter BP can then be eliminated In order to be able to execute the phase measurement with high sensitivity and precision, the phase $\phi$ is held constant at the phase detector PD. To that end, the phase of the drive signal at the interdigital transducer IDW must be correspondingly modified by a feedback RK. The feedback signal is acquired by comparing the output signal $U_A$ of the phase detector PD to a reference value SW in a regulator R that is connected to an output of the phase detector PD. In the embodiment shown in FIG. 1, the regulator R is composed of a comparator V for comparing the output signal $U_A$ of the phase detector to the reference value SW and for calculating a control difference, and is further composed of a feedback control amplifier RV. The reference value SW should be set such that the operating point on the characteristic curve of the phase detector PD is situated in the steepest region of this characteristic curve (see FIG. 3) since the greatest sensitivity and precision are thereby achieved. The control difference is then supplied to a feedback control amplifier RV (having P or PI behavior) and subsequently modifies, for example, the phase $\phi$ of the drive signal via the controllable phase shifter PS which is connected between signal generator SG and the power amplifier LV. Instead of such a phase shifting, a frequency modulation or phase modulation of the signal generator SG can also be used since only the phase difference is critical. It is likewise possible to modify the frequency of the signal generator SG or the signal generator SG for a defined time period and to subsequently return to the reference value and to thus achieve a phase shift. This is particularly feasible for a computer-controlled apparatus. Such an apparatus for phase shifting is already integrated in mass-produced fashion in some commercially obtainable generators such as, for example, models HP8656 and HP8642 manufactured by Hewlett-Packard Co. The manipulated variable itself can then be used as measuring signal MS. However, in a somewhat more complicated fashion, the measuring signal MS can also be acquired by measuring the phase difference of the signal modulating the primary beam PE and the signal exciting the interdigital transducer IDW. Such a phase shifting or modulation can be implemented with extremely great precision over a broad frequency range. This is a significant advantage over prior art methods for phase measurement.

With the use of a phase shifter PS, it is also possible to change the phase of the reference frequency supplied to the phase detector PD, which corresponds to the signal frequency $f_s$. For the execution of the phase shifting an independent phase shifter is not absolutely necessary. A phase shifting can also be effected by a frequency or phase modulation.

Figure 2:
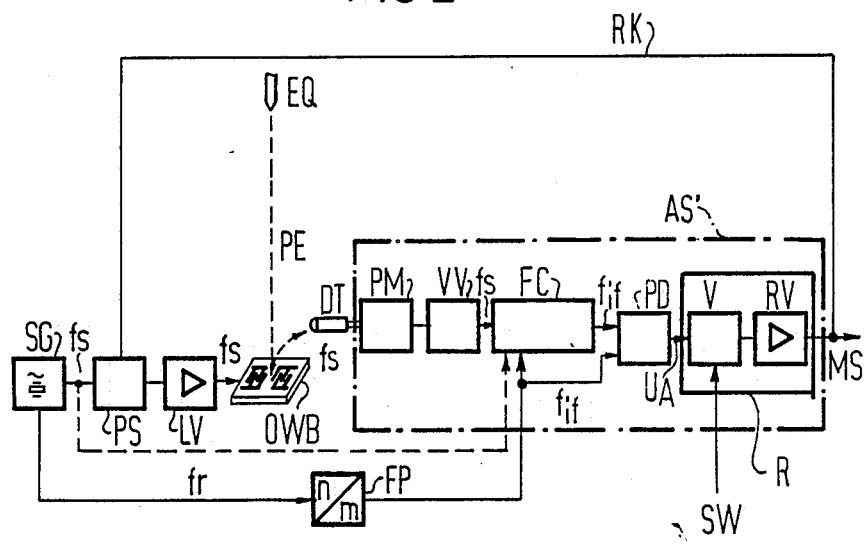

FIG. 2 shows an alternative embodiment for the implementation of the method of the present invention. The circuit corresponds to the circuit of FIG. 1 in terms of the essential points and corresponding reference characters from FIG. 1 are used. A disadvantage of the circuit shown in FIG. 1 is that the phase detection must occur at the signal frequency $f_s$, which may vary in a very wide range of frequencies. Therefore, it is advantageous to perform a conversion of the signal frequency $f_s$ to a fixed intermediate frequency $f_{if}$ before the phase detection, as illustrated in the circuit shown in FIG. 2. The evaluation circuit AS therefore contains a device for frequency conversion FC which is connected between the pre-amplifier VV and the phase detector PD. The device for the frequency conversion FC can contain a band pass filter for the filtering of the secondary electron signal with the signal frequency $f_s$, and a following mixer with a voltage-controlled frequency oscillator. The band pass filter is connected to the signal generator SG, for changing its center frequency, analoguely as in the arrangement according to FIG. 1. During the frequency conversion, the phase of the secondary electron signal must be preserved, except for constant phase shifting. Therefore, a synchronization with the signal generator SG is necessary. Preferably, the intermediate frequency $f_{if}$ should be selected such that it can be obtained by a simple division or multiplication from a reference frequency $f_r$ of the drive signals of the signal generator SG. The mixer in the device for the frequency conversion FC is therefore connected to the signal generator SG, via a frequency divider or frequency multiplier FP. The phase detector PD is also supplied with a signal with the intermediate frequency $f_{if}$ as a reference signal, via the frequency divider or frequency mu FP. The frequency divider or frequency multiplier FP can be eliminated, if the reference frequency $f_r$ itself of the signal generator SG is selected as the fixed intermediate frequency $f_{if}$.

Figure 3:
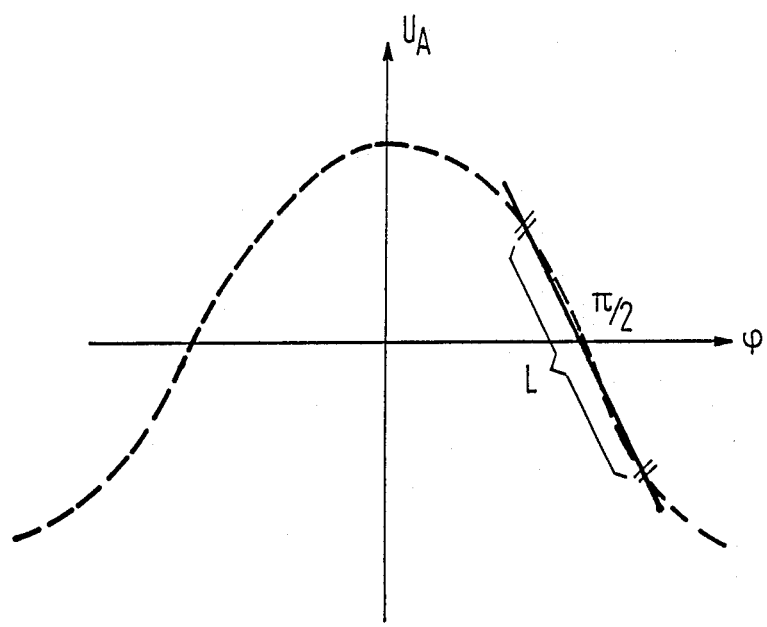
FIG. 3 is a graph of the output characteristic of a phase detector as a function of the phase of an input signal.

FIG. 3 shows the output characteristic curve of a phase detector in which the function of the output voltage $U_A$ is presented as a function of the phase $\phi$. As already indicated in FIG. 1, most phase detectors have a $\cos \phi$ characteristic that, however, can be linearized in a region L around the point $\phi = \pi/2$. The output voltage is proportional to the phase difference within this approximately linear region L. At the same time, this region is the steepest portion of the characteristic curve. Even small changes in the phase difference produce great changes in the output voltage $U_A$ of the phase detector PD. A measurement of the phase difference having extremely great sensitivity and, as a result thereof, also having great precision is therefore possible in this region.

The function of the feedback RK in the apparatus of FIG. 1 and in the apparatus of FIG. 2 is to keep the operating point of the phase detector PD constant within the linear region L. Measuring the phase outside of this linear region L is only possible with low sensitivity and, thus, with rather pronounced errors.

The excitation of the surface waves need not necessarily be produced with an interdigital transducer IDW. An excitation in a photoacoustic or electronacoustic manner is also possible. In the case of the electronacoustic activation, the waves are generated with a primary beam. The waves can then be detected either with a second primary beam, or with an interdigital transducer IDW. In the case of the reception of the waves with an interdigital transducer no independent detector exists (see K. Jamonouchi et al: "Exciting of surface acoustic waves using electron acoustic microscope", Jap Journ. Appl. Phys. 23, 1984, p. 191-193 and H. P. Feuerbaum et al "Examination of surface acoustic wave components using a scanning electron microscope", SEM 1983/1, p. 55-63 incorporated herein by reference). The method disclosed here, can be transferred analoguely to all other phase measurements with an electron or laser probe.

Phase measurements of surface acoustic waves with the laser probe are described, for example, in the publications of H. Engan, IEEE Transactions on sonics and ultrasonics 29", 1982, page 281 and IEEE Transactions on sonics and ultrasonics 25", 1978, page 372, wherein voltage measurements in the frequency domain with an electron probe are known for example, in the German patent application Nos. P 37 25 313.1 and P 37 25 355.7, the arrangement also being used for phase measurement in accordance with the methods set forth herein. (Both publications and the German patent application Nos. P 37 25 313.1 and P 37 25 355.7 are hereby incorporated by reference).

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for phase measurement of specimen signals at a measuring point on a specimen, whereby at least one point on a surface of the specimen is scanned by a particle beam and whereby a secondary electrical signal is derived via a detector at the scanned measuring point on the surface of the specimen and is supplied to an evaluation unit having a phase detector, and whereby the specimen is supplied with drive signals, comprising the phase of the secondary electrical signal being kept constant at the phase detector; the specimen being provided with drive signals having a signal frequency ($f_s$); the control signal being a reference signal having a reference frequency corresponding to the signal frequency ($f_s$), the control signal being obtained from the drive signals for the specimen; the secondary electrical signal with the signal frequency ($f_s$) being mixed with the control signal which has the reference frequency; and the phase of the secondary electrical signal being preserved during the mixing, for a constant phase shifting.

2. The method for phase measuring according to claim 1, wherein the specimen signals at a measuring point are acoustic surface waves.

3. The method for phase measuring according to claim 2, wherein the specimen signals are acoustic surface waves on piezoelectrical substrates wherein the acoustic surface waves are excited on the surface of a specimen having piezoelectrical qualities, and whereby the local electrical field accompanying the surface is scanned at at least one point on the surface of the specimen by the particle beam.

4. A method for phase measurement of specimen signals at a measuring point on a specimen, whereby at least one point on a surface of the specimen is scanned by a particle beam and whereby a secondary electrical signal is derived via a detector at the scanned measuring point on the surface of the specimen and is supplied to an evaluation unit having a phase detector, and whereby the specimen is supplied with drive signals, comprising the phase of the secondary electrical signal being kept constant at the phase detector; the phase difference being kept constant in the steepest section of an output characteristic curve of the phase detector between the secondary electrical signal and a reference signal.

5. A method for phase measurement of specimen signals at a measuring point on a specimen, whereby at least one point on a surface of the specimen is scanned by a particle beam and whereby a secondary electrical signal is derived via a detector at the scanned measuring point on the surface of the specimen and is supplied to an evaluation unit having a phase detector, and whereby the specimen is supplied with drive signals, comprising the phase of the secondary electrical signal being kept constant at the phase detector; the phase of the secondary electrical signal being controlled via a feedback; a feedback signal of the feedback being acquired from a comparison of an output signal of the phase detector with a reference value; and the feedback signal being used to influence the phase of the drive signals for the specimen such that the phase difference of the input signals at the phase detector remains constant.

6. A method for phase measurement of specimen signals at a measuring point on a specimen, whereby at least one point on a surface of the specimen is scanned by a particle beam and whereby a secondary electrical signal is derived via a detector at the scanned measuring point on the surface of the specimen and is supplied to an evaluation unit having a phase detector, and whereby the specimen is supplied with drive signals, comprising the phase of the secondary electrical signal being kept constant at the phase detector; the phase of the secondary electrical signal being controlled via a feedback; a feedback signal of the feedback being acquired from a comparison of an output signal of the phase detector with a reference value; the feedback signal being used to influence the phase of a reference signal with a reference frequency for the phase detector such that the phase difference of the input signals at the phase detector remains constant.

7. The method for phase measuring according to claim 2, wherein the amplitude, the frequency and the phase of the acoustic surface wave excited on the surface of a specimen, is set via the electrical drive signals of a device producing the surface waves.

8. An apparatus for phase measuring of signals at a measuring point with a particle beam generator for scanning a specimen surface on a specimen, with a signal chain for the conversion of a secondary signal derived from a measuring point on the specimen, whereby the signal chain has an evaluation circuit, the evaluation circuit having a phase detector, and the phase detector being fed a reference signal having a reference frequency and the secondary signal, comprising a regulator having a first input connected to an output of the phase detector, a reference value being connected to a second input of the regulator, and the output of the regulator providing a control signal; the regulator containing a comparator for the comparison of the output signal of the phase detector with the reference value and having its output connected to an input of a feedback-control amplifier.

9. The device for phase measuring according to claim 8, wherein the signal chain contains a detector for the detection of the secondary electrical signals.

10. An apparatus for phase measuring of signals at a measuring point with a particle beam generator for scanning a specimen surface on a specimen, with a signal chain for the conversion of a secondary signal derived from a measuring point on the specimen, whereby the signal chain has an evaluation circuit, the evaluation circuit having a phase detector, and the phase detector being fed a reference signal having a reference frequency and the secondary signal, comprising a regulator having a first input connected to an output of the phase detector, a reference value being connected to a second input of the regulator, and the output of the regulator providing a control signal; the phase detector being a lock-in amplifier.

11. An apparatus for phase measuring of signals at a measuring point with a particle beam generator for scanning a specimen surface on a specimen, with a signal chain for the conversion of a secondary signal derived from a measuring point on the specimen, whereby the signal chain has an evaluation circuit, the evaluation circuit having a phase detector, and the phase detector being fed a reference signal having a reference frequency and the secondary signal, comprising a regulator having a first input connected to an output of the phase detector, a reference value being connected to a second input of the regulator, and the output of the regulator providing a control signal; the evaluation circuit containing a variable filter preceding the phase detector for filtering-out the secondary electrical signal; and the variable filter being connected to the signal generator for the control of a center frequency thereof.

12. An apparatus for phase measuring of signals at a measuring point with a particle beam generator for scanning a specimen surface on a specimen, with a signal chain for the conversion of a secondary signal derived from a measuring point on the specimen, whereby the signal chain has an evaluation circuit, the evaluation circuit having a phase detector, and the phase detector being fed a reference signal having a reference frequency and the secondary signal, comprising a regulator having a first input connected to an output of the phase detector, a reference value being connected to a second input of the regulator, and the output of the regulator providing a control signal; the evaluation circuit containing a frequency converter before the phase detector for the conversion of the signal frequency ($f_s$) of the secondary signal onto a fixed intermediate frequency ($f_{if}$); the frequency converter containing a variable filter with a following mixer and voltage controlled frequency oscillator; and the variable filter and the mixer being connected to the signal generator.

13. An apparatus for phase measuring of signals at a measuring point with a particle beam generator for scanning a specimen surface on a specimen, with a signal chain for the conversion of a secondary signal derived from a measuring point on the specimen, whereby the signal chain has an evaluation circuit, the evaluation circuit having a phase detector, and the phase detector being fed a reference signal having a reference frequency and the secondary signal, comprising a regulator having a fist input connected to an output of the phase detector, a reference value being connected to a second input of the regulator, and the output of the regulator providing a control signal; the evaluation circuit containing a frequency converter before the phase detector for the conversion of the signal frequency ($f_s$) of the secondary signal onto a fixed intermediate frequency ($f_{if}$); a frequency multiplier being connected between the signal generator and the frequency converter.

14. An apparatus for phase measuring of signals at a measuring point with a particle beam generator for scanning a specimen surface on a specimen, with a signal chain for the conversion of a secondary signal derived from a measuring point on the specimen, whereby the signal chain has an evaluation circuit, the evaluation circuit having a phase detector, and the phase detector being fed a reference signal having a reference frequency and the secondary signal, comprising a regulator having a first input connected to an output of the phase detector, a reference value being connected to a second input of the regulator, and the output of the regulator providing a control signal; the specimen being connected to a signal generator for the driving of the specimen with drive signals; a phase shifter being switched between the signal generator and the specimen; and an output of the regulator being connected with the phase shifter via a feedback.

15. An apparatus for phase measuring of signals at a measuring point with a particle beam generator for scanning a specimen surface on a specimen, with a signal chain for the conversion of a secondary signal derived from a measuring point on the specimen, whereby the signal chain has an evaluation circuit, the evaluation circuit having a phase detector, and the phase detector being fed a reference signal having a reference frequency and the secondary signal, comprising a regulator having a first input connected to an output of the phase detector, a reference value being connected to a second input of the regulator, and the output of the regulator providing a control signal; the specimen being connected to a signal generator for the driving of the specimen with drive signals; a phase shifter being switched between the signal generator and an input of the phase detector; and an output of the regulator being connected to the phase shifter via feedback.

16. The apparatus for phase measuring according to claim 8, wherein the evaluation circuit contains a photomultiplier with a following pre-amplifier which are located at the input of the evaluation circuit.

17. An apparatus for phase measuring of signals at a measuring point with a particle beam generator for scanning a specimen surface on a specimen, with a signal chain for the conversion of a secondary signal derived from a measuring point on the specimen, whereby the signal chain has an evaluation circuit, the evaluation circuit having a phase detector, and the phase detector being fed a reference signal having a reference frequency and the secondary signal, comprising a regulator having a first input connected to an output of the phase detector, a reference value being connected to a second input of the regulator, and the output of the regulator providing a control signal; the specimen signals being acoustic surface waves; a device for the creation of the acoustic surface waves being connected to a signal generator via a power amplifier; the acoustic surface waves being produced by a interdigital transducer.

18. An apparatus for phase measuring of signals at a measuring point with a particle beam generator for scanning a specimen surface on a specimen, with a signal chain for the conversion of a secondary signal derived from a measuring point on the specimen, whereby the signal chain has an evaluation circuit, the evaluation circuit having a phase detector, and the phase detector being fed a reference signal having a reference frequency and the secondary signal, comprising a regulator having a first input connected to an output of the phase detector, a reference value being connected to a second input of the regulator, and the output of the regulator providing a control signal; the specimen signals being acoustic surface waves; a device for the creation of the acoustic surface waves being connected to a signal generator via a power amplifier; the acoustic surface waves being excited by a laser.

19. An apparatus for phase measuring of signals at a measuring point with a particle beam generator for scanning a specimen surface on a specimen, with a signal chain for the conversion of a secondary signal derived from a measuring point on the specimen, whereby the signal chain has an evaluation circuit, the evaluation circuit having a phase detector, and the phase detector being fed a reference signal having a reference frequency and the secondary signal, comprising a regulator having a first input connected to an output of the phase detector, a reference value being connected to a second input of the regulator, and the output of the regulator providing a control signal; the specimen signals being acoustic surface waves; a device for the creation of the acoustic surface waves being connected to a signal generator via a power amplifier; the acoustic surface waves being excited by an electron beam.

20. The apparatus for phase measuring according to claim 12, wherein a frequency divider is connected between the signal generator and the mixer.

21. The apparatus for phase measuring according to claim 12, wherein a frequency divider is connected between the signal generator and the frequency converter.

22. The apparatus for phase measuring according to claim 10, wherein the evaluation circuit contains a photomultiplier with a following pre-amplifier which are located at the input of the evaluation circuit.

23. The apparatus for phase measuring according to claim 13, wherein the evaluation circuit contains a photomultiplier with a following pre-amplifier which are located at the input of the evaluation circuit.

24. The apparatus for phase measuring according to claim 14, wherein the evaluation circuit contains a photomultiplier with a following pre-amplifier which are located at the input of the evaluation circuit.

25. The apparatus for phase measuring according to claim 15, wherein the evaluation circuit contains a photomultiplier with a following pre-amplifier which are located at the input of the evaluation circuit.

26. The apparatus for phase measuring according to claim 17, wherein the evaluation circuit contains a photomultiplier with a following pre-amplifier which are located at the input of the evaluation circuit.

27. The device for phase measuring according to claim 10, wherein the signal chain contains a detector for the detection of the secondary electrical signals.

28. The device for phase measuring according to claim 11, wherein the signal chain contains a detector for the detection of the secondary electrical signals.

29. The device for phase measuring according to claim 12, wherein the signal chain contains a detector for the detection of the secondary electrical signals.

30. The device for phase measuring according to claim 13, wherein the signal chain contains a detector for the detection of the secondary electrical signals.

31. The device for phase measuring according to claim 14, wherein the signal chain contains a detector for the detection of the secondary electrical signals.

32. The device for phase measuring according to claim 15, wherein the signal chain contains a detector for the detection of the secondary electrical signals.

33. The device for phase measuring according to claim 17, wherein the signal chain contains a detector for the detection of the secondary electrical signals.

34. The device for phase measuring according to claim 18, wherein the signal chain contains a detector for the detection of the secondary electrical signals.

35. The device for phase measuring according to claim 19, wherein the signal chain contains a detector for the detection of the secondary electrical signals.

* * * * *